US011201606B2

(12) United States Patent
Di et al.

(10) Patent No.: US 11,201,606 B2
(45) Date of Patent: Dec. 14, 2021

(54) CSAMT TRANSMITTER (71) Applicant: INSTITUTE OF GEOLOGY AND GEOPHYSICS, THE CHINESE ACADEMY OF SCIENCES, Beijing (CN)

(72) Inventors: Qingyun Di, Beijing (CN); Qihui Zhen, Beijing (CN); Quanmin Yang, Beijing (CN)

(73) Assignee: INSTITUTE OF GEOLOGY AND GEOPHYSICS, THE CHINESE ACADEMY OF SCIENCES, Beijing (CN)

( * ) Notice: Subject to any disclaimer, the term of this patent is extended or adjusted under 35 U.S.C. 154(b) by 63 days.

(21) Appl. No.: 16/878,643

(22) Filed: May 20, 2020

(65) Prior Publication Data

US 2020/0280304 A1    Sep. 3, 2020

Related U.S. Application Data (63) Continuation of application No. PCT/CN2018/119182, filed on Dec. 4, 2018.

(30) Foreign Application Priority Data

Dec. 8, 2017 (CN) .......................... 201711294489.8

(51) Int. Cl.
H03K 3/353 (2006.01)
(52) U.S. Cl.
CPC .................... *H03K 3/353* (2013.01)
(58) Field of Classification Search
CPC ..................................................... H03K 3/353
See application file for complete search history.

(56) References Cited

U.S. PATENT DOCUMENTS

2011/0319014 A1* 12/2011 Canegallo ............ H04B 5/0012
455/41.1
2011/0319015 A1* 12/2011 Canegallo ............ H04B 5/0012
455/41.1

(Continued)

FOREIGN PATENT DOCUMENTS

CN         101620277 A        1/2010
CN         204511070 U   *    7/2015
(Continued)

OTHER PUBLICATIONS

International Search Report issued in corresponding International application No. PCT/CN2018/119182, dated Mar. 4, 2019.

(Continued)

*Primary Examiner* — Adam D Houston (57) ABSTRACT

The present invention discloses a CSAMT transmitter, including: a first transmitter, where the first transmitter includes a first generator, a first rectifier module, a first transmission module, and a second transmission module, the first generator is connected to the first transmission module and the second transmission module by using the first rectifier module; and a second transmitter, where the second transmitter includes a second generator, a second rectifier module, a third transmission module, and a fourth transmission module, the second generator is connected to the third transmission module and the fourth transmission module by using the second rectifier module, where the first transmission module is connected to the third transmission module, and the second transmission module is connected to the fourth transmission module; the first transmission module has the same voltage as the third transmission module, and the second transmission module has the same voltage as the fourth transmission module.

11 Claims, 9 Drawing Sheets

(56) References Cited

U.S. PATENT DOCUMENTS

| | | | |
|---|---|---|---|
| 2014/0285016 A1 | 9/2014 | Tetu et al. | |
| 2020/0280304 A1* | 9/2020 | Di | H03F 3/2173 |
| 2020/0295663 A1* | 9/2020 | Yelaverthi | H02M 1/08 |
| 2021/0036553 A1* | 2/2021 | Hu | H01F 27/38 |
| 2021/0210984 A1* | 7/2021 | Peralta | H02J 50/80 |
| 2021/0210992 A1* | 7/2021 | Luzinski | H04B 5/0081 |
| 2021/0211161 A1* | 7/2021 | Peralta | H02J 50/40 |

FOREIGN PATENT DOCUMENTS

| | | | | |
|---|---|---|---|---|
| CN | 205265961 U | * | 5/2016 | |
| CN | 106094044 A | * | 11/2016 | |
| CN | 106199734 A | * | 12/2016 | |
| CN | 106802430 A | * | 6/2017 | |
| CN | 106802430 A | | 6/2017 | |
| CN | 106802431 A | | 6/2017 | |
| CN | 108055013 A | * | 5/2018 | H03F 3/2173 |
| CN | 108055013 A | | 5/2018 | |
| CN | 108656994 B | * | 5/2018 | |
| CN | 213817361 U | * | 7/2020 | |
| CN | 211507537 U | * | 9/2020 | |
| CN | 212085896 U | * | 12/2020 | |
| CN | 112531916 A | * | 3/2021 | |
| CN | 112636481 A | * | 4/2021 | |
| CN | 112688437 A | * | 4/2021 | |
| CN | 112701800 A | * | 4/2021 | |
| CN | 112737137 A | * | 4/2021 | |
| WO | WO-2013114818 A1 | * | 8/2013 | H03K 17/687 |
| WO | WO-2021112870 A1 | * | 6/2021 | |

OTHER PUBLICATIONS

Written Opinion of the international Searching Authority for No. PCT/CN2018/119182.

* cited by examiner

CSAMT TRANSMITTER

CROSS-REFERENCE TO RELATED APPLICATIONS

The present application is a continuation-application of International (PCT) Patent Application No. PCT/CN2018/119182 filed on Dec. 4, 2018, which claims foreign priorities of Chinese Patent Application No. 201711294489.8, filed on Dec. 8, 2017, the entire contents of which are hereby incorporated by reference.

TECHNICAL FIELD

The present invention relates to the field of transmitter technologies, and in particular, to a CSAMT transmitter, to shape a waveform of a transmission current when a pole pitch is greater than 1 km.

BACKGROUND

Currently, transmitter research involves a conventional single-transmitter system, a dual-transmitter system, and a multiple-transmitter system that are proposed in this application. For electrical source electromagnetic exploration, at a high frequency, the conventional single-transmitter system cannot have a high transmission current. For example, at a low frequency, a transmission current can be above 60 A while at a high frequency of about 10 kHz, the transmission current may be only 5 A, and a transmission ability of a transmitter is not fully used. In the proposed dual-transmitter system and multiple-transmitter system, the problem that there is no high transmission current at a high frequency is resolved, and a transmission ability of a transmitter is fully used. Various deployment structures such as a structure of three power supply lines, a staggered deployment structure, a cascaded deployment structure, and an MTEM transmitter deployment structure are proposed before this application, to achieve different effects. For example, in the structure of three power supply lines, a current at a high frequency can be higher than a current at a low frequency, in the staggered deployment structure, a higher dipole source can be obtained at the same transmit power; in the cascaded deployment structure, more transmitter combinations can be obtained to implement transmission at ultra-high power; and in the MTEM transmitter deployment structure, a waveform of a transmission current can be shaped under certain conditions.

None of the foregoing various transmitters except for the MTEM transmitter deployment structure imposes a shaping constraint on a waveform of a transmission current. Because a transmission pole pitch of an MTEM transmitter is not large, is less than 1 km, and is usually 100 m to 300 m, inductance of a power supply line is about 1 mH. Therefore, a waveform of a transmission current can be shaped by using the MTEM transmitter deployment structure. For a controlled source audio-frequency magnetotelluric (CSAMT) transmitter, when a pole pitch is 1 km to 2 km, inductance of a power supply line reaches 3 mH to 6 mH due to high load induction. In this case, if the MTEM transmitter deployment structure is still used, it is difficult to shape a waveform of a transmission current. The technology of the present invention is intended to shape a waveform of a transmission current when a pole pitch is greater than 1 km.

SUMMARY

To overcome disadvantages in the prior art, the present invention provides a CSAMT transmitter.

To achieve the foregoing objective, the present invention uses the following technical solutions: A CSAMT transmitter is provided, and includes:

a first transmitter, where the first transmitter includes a first generator, a first rectifier module, a first transmission module, and a second transmission module, and the first generator is connected to the first transmission module and the second transmission module by using the first rectifier module; and a second transmitter, where the second transmitter includes a second generator, a second rectifier module, a third transmission module, and a fourth transmission module, and the second generator is connected to the third transmission module and the fourth transmission module by using the second rectifier module, where the first transmission module is connected to the third transmission module, and the second transmission module is connected to the fourth transmission module; and the first transmission module has the same voltage as the third transmission module, and the second transmission module has the same voltage as the fourth transmission module.

The first transmission module and the second transmission module have the same synchronous drive signal, and the third transmission module and the fourth transmission module have the same synchronous drive signal.

A positive pole of power link of the first transmission module is connected to a positive pole of power link of the third transmission module, a negative pole of power link of the first transmission module is connected to a negative pole of power link of the third transmission module, a positive pole of power link of the second transmission module is connected to a positive pole of power link of the fourth transmission module, and a negative pole of power link of the second transmission module is connected to a negative pole of power link of the fourth transmission module.

Both a bridge arm of the first transmission module and a bridge arm of the second transmission module are connected to a left electrode, and both a bridge arm of the third transmission module and a bridge arm of the fourth transmission module are connected to a right electrode.

Upper switching transistors of the first transmission module and the second transmission module and lower switching transistors of the third transmission module and the fourth transmission module are simultaneously turned on or turned off; and lower switching transistors of the first transmission module and the second transmission module and upper switching transistors of the third transmission module and the fourth transmission module are simultaneously turned on or turned off.

Transmission module extension can be further performed on the first transmitter, an extended transmission module is connected to the first rectifier module, and a bridge arm of the extended transmission module is connected to the left electrode; and transmission module extension can be further performed on the second transmitter, an extended transmission module is connected to the second rectifier module, and a bridge arm of the extended transmission module is connected to the right electrode.

The first transmission module is connected to the third transmission module by using a power supply line, and the second transmission module is connected to the fourth transmission module by using a power supply line.

A distance between the power supply lines is greater than 1 meter, and a distance between the ground and each of the power supply lines is greater than 1 meter.

Beneficial effects of the present invention are as follows: For the CSAMT transmitter, when a pole pitch is 1 km to 2 km, inductance of a power supply line reaches 3 mH to 6 mH due to high load induction, and load inductance can reach 4 mH to 8 mH due to mutual inductance of the ground. In this case, if an MTEM transmitter deployment structure is still used, it is difficult to shape a waveform of a transmission current. According to the present invention, a waveform of a transmission current can be effectively shaped when a pole pitch is greater than 1 km.

DESCRIPTION OF EMBODIMENTS

To make the objectives, technical solutions, and advantages of the present invention more clearly, the following further describes the present invention in detail with reference to the accompanying drawings and specific embodiments. It should be understood that the specific embodiments described herein are merely intended to explain the present invention, and are not intended to limit the present invention.

The present invention provides a CSAMT transmitter, including a first transmitter 1 and a second transmitter 2.

Figure 1:
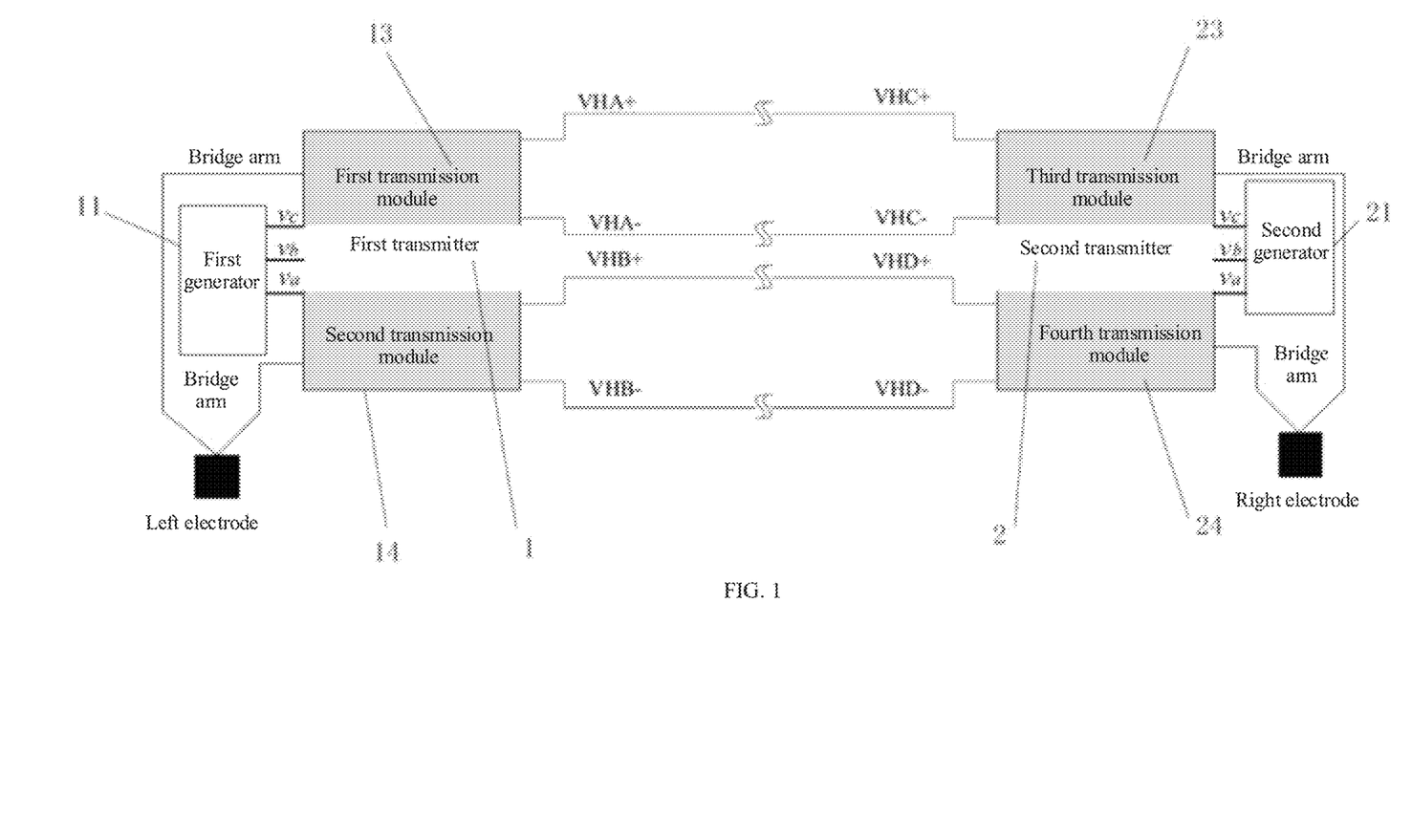
FIG. 1 is a system block diagram of an embodiment of a CSAMT transmitter in the present invention.
Figure 2:
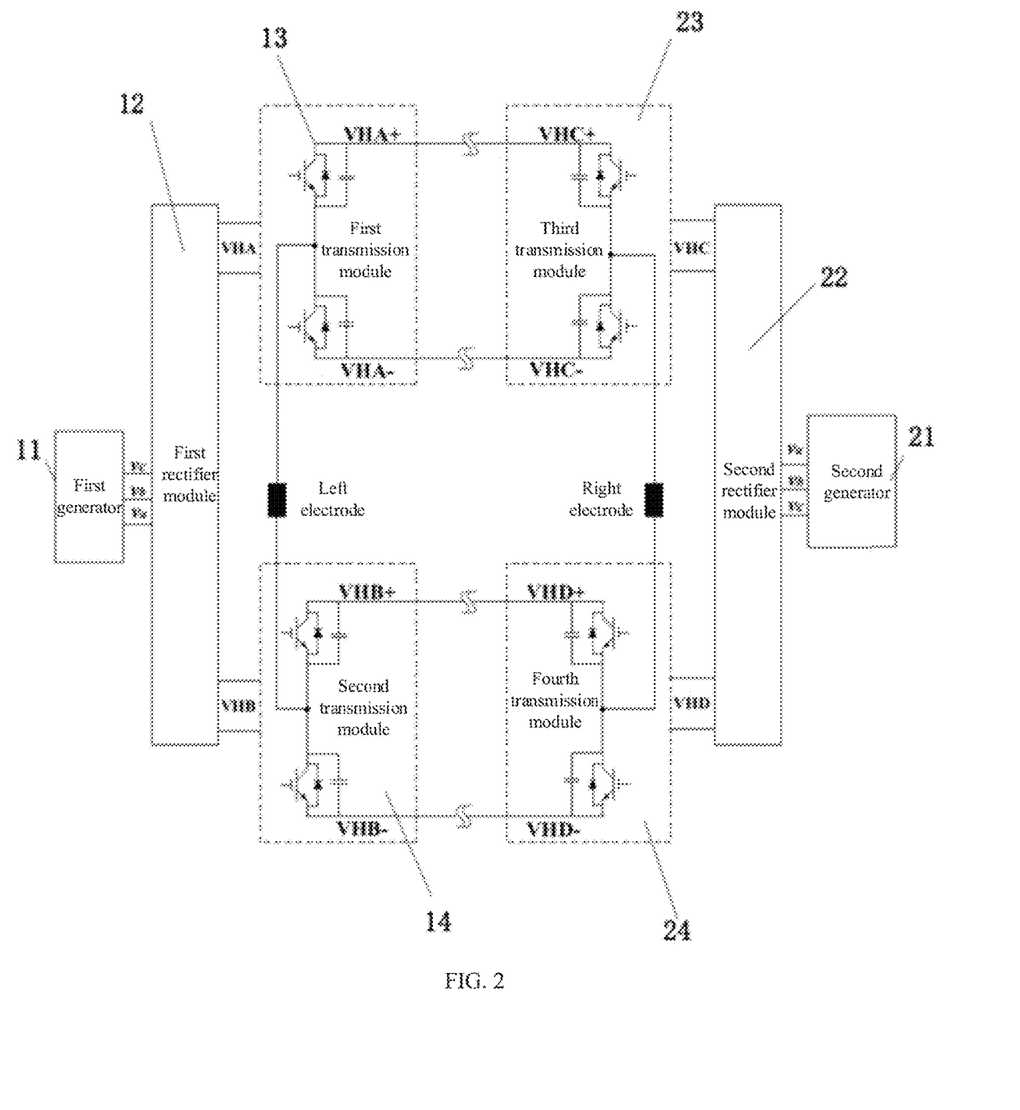
FIG. 2 is a module diagram of a circuit principle of a CSAMT transmitter shown in FIG. 1.

As shown in FIG. 1 and FIG. 2, the first transmitter 1 includes a first generator 11, a first rectifier module 12, a first transmission module 13, and a second transmission module 14. The first generator 11 is connected to the first transmission module 13 and the second transmission module 14 by using the first rectifier module 12. The first rectifier module 12 is not shown in FIG. 1, and reference is made to FIG. 2.

The second transmitter 2 includes a second generator 21, a second rectifier module 22, a third transmission module 23, and a fourth transmission module 24. The second generator 21 is connected to the third transmission module 23 and the fourth transmission module 24 by using the second rectifier module 22.

The first transmission module 13 is connected to the third transmission module 23, and the second transmission module 14 is connected to the fourth transmission module 24.

The first transmission module 13 has the same voltage as the third transmission module 23, and the second transmission module 14 has the same voltage as the fourth transmission module 24.

In an embodiment, the first transmission module 13 and the second transmission module 14 have the same synchronous drive signal, and the third transmission module 23 and the fourth transmission module 24 have the same synchronous drive signal.

In an embodiment, as shown in FIG. 1 and FIG. 2, a positive pole of power link of the first transmission module 13 is connected to a positive pole of power link of the third transmission module 23, a negative pole of power link of the first transmission module 13 is connected to a negative pole of power link of the third transmission module 23, a positive pole of power link of the second transmission module 14 is connected to a positive pole of power link of the fourth transmission module 24, and a negative pole of power link of the second transmission module 14 is connected to a negative pole of power link of the fourth transmission module 24.

In an embodiment, as shown in FIG. 1 and FIG. 2, both a bridge arm of the first transmission module 13 and a bridge arm of the second transmission module 14 are connected to a left electrode, and both a bridge arm of the third transmission module 23 and a bridge arm of the fourth transmission module 24 are connected to a right electrode.

In an embodiment, as shown in FIG. 2, upper switching transistors of the first transmission module 13 and the second transmission module 14 and lower switching transistors of the third transmission module 23 and the fourth transmission module 24 are simultaneously turned on or turned off.

In an embodiment, as shown in FIG. 2, lower switching transistors of the first transmission module 13 and the second transmission module 14 and upper switching transistors of the third transmission module 23 and the fourth transmission module 24 are simultaneously turned on or turned off.

In an embodiment, as shown in FIG. 2, transmission module extension can be further performed on the first transmitter 1, an extended transmission module is connected to the first rectifier module 12, and a bridge arm of the extended transmission module is connected to the left electrode. Transmission module extension can be performed on the first transmitter 1 when it is ensured that the first rectifier module 12 can output enough electric energy.

In an embodiment, as shown in FIG. 2, transmission module extension can be further performed on the second transmitter 2, an extended transmission module is connected to the second rectifier module 22, and a bridge arm of the extended transmission module is connected to the right electrode. Transmission module extension can be performed on the second transmitter 2 when it is ensured that the second rectifier module 22 can output enough electric energy.

In the foregoing two embodiments, transmission module extension needs to be performed on the second transmitter 2 when transmission module extension is performed on the first transmitter 1, so that the transmission modules of the first transmitter 1 match the transmission modules of the second transmitter 2.

In an embodiment, as shown in FIG. 1 and FIG. 2, the first transmission module 13 is connected to the third transmission module 23 by using a power supply line, and the second transmission module 14 is connected to the fourth transmission module 24 by using a power supply line.

In an embodiment, a distance between the power supply lines is greater than 1 meter, and a distance between the ground and each of the power supply lines is greater than 1 meter.

For the CSAMT transmitter in the present invention, when a pole pitch is 1 km to 2 km, inductance of a power supply line reaches 3 mH to 6 mH due to high load induction. In this case, a conventional transmitter cannot have a transmission current with a normal waveform, and if an MTEM transmitter deployment structure is used, it is also difficult to shape a waveform of a transmission current. The technology of the present invention is intended to shape a waveform of a transmission current when a pole pitch is greater than 1 km. According to the present invention, transmission can be performed at a pole pitch greater than 1 km, and it is ensured that a current waveform is better shaped.

Figure 3:
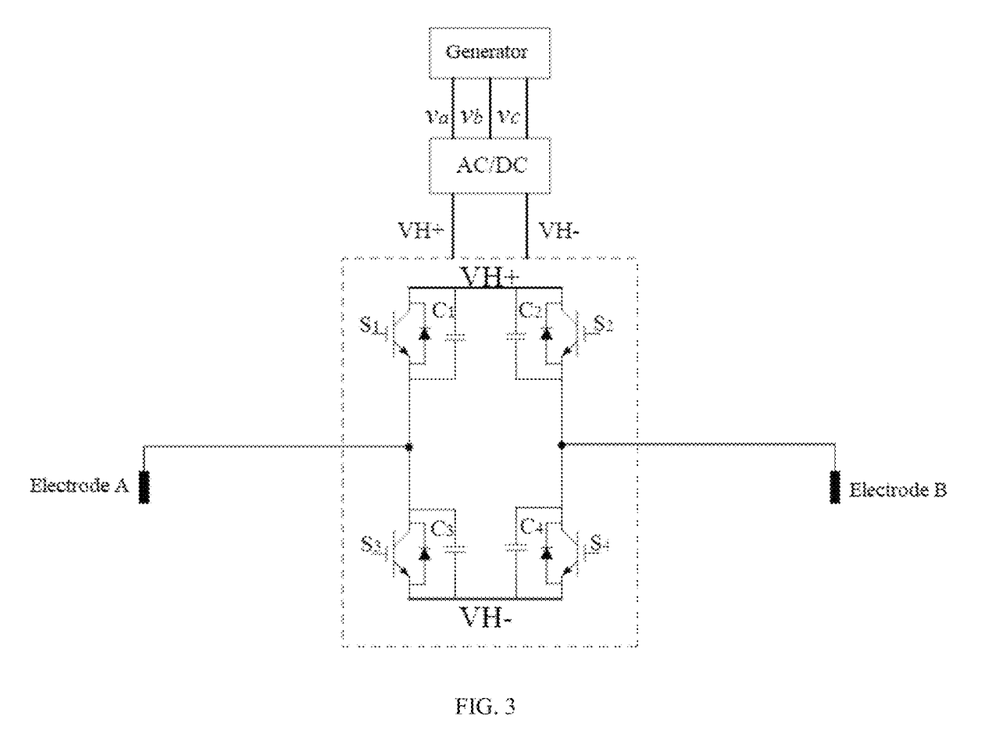
FIG. 3 is a schematic diagram of a conventional transmitter structure.
Figure 4:
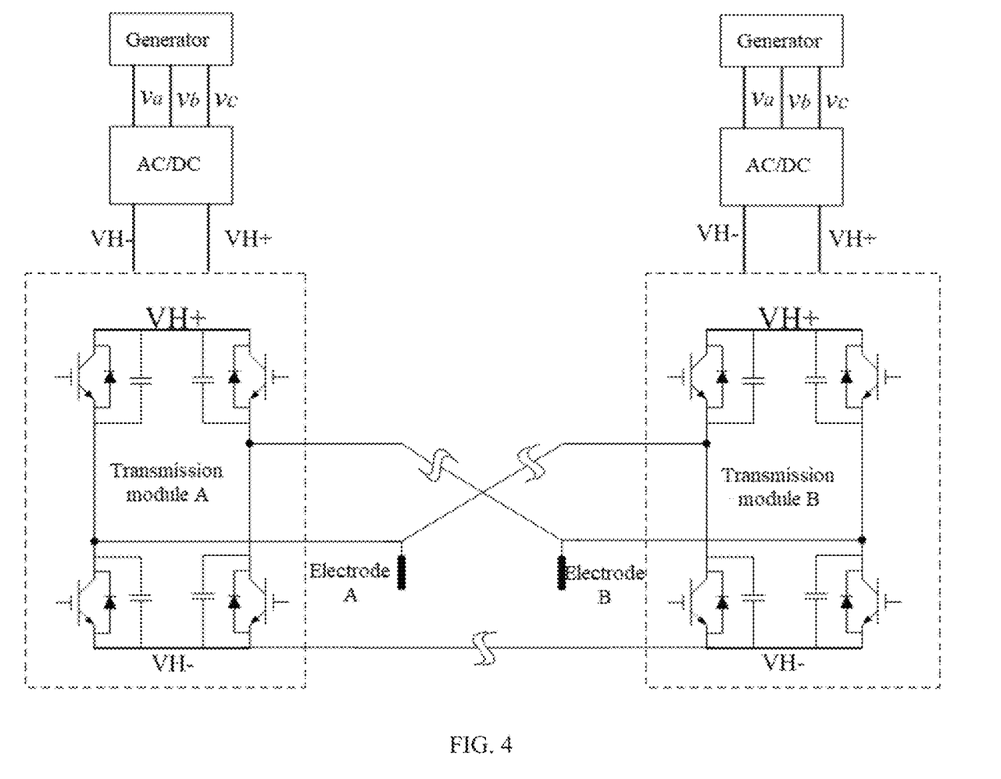
FIG. 4 is a schematic diagram of an MTEM transmitter structure.

To illustrate the advantages of the present invention, a comparison is made between the conventional transmitter structure, the MTEM transmitter structure, and the structure in the present invention under the same transmission condition. FIG. 3 shows the conventional transmitter structure in which one transmitter is configured. The transmitter includes one generator, one rectifier module, and one transmission module. FIG. 4 shows the MTEM transmitter structure in which two transmitters are configured. Each of the two transmitters includes one generator, one rectifier module, and one transmission module. Electrodes of the two transmission modules are connected to only an electrode A and an electrode B, and the biggest difference from the present invention is that there is no technical solution of connecting positive voltage electrodes and negative voltage electrodes of each transmission module pair of the two transmitters by using power supply lines.

Figure 5:
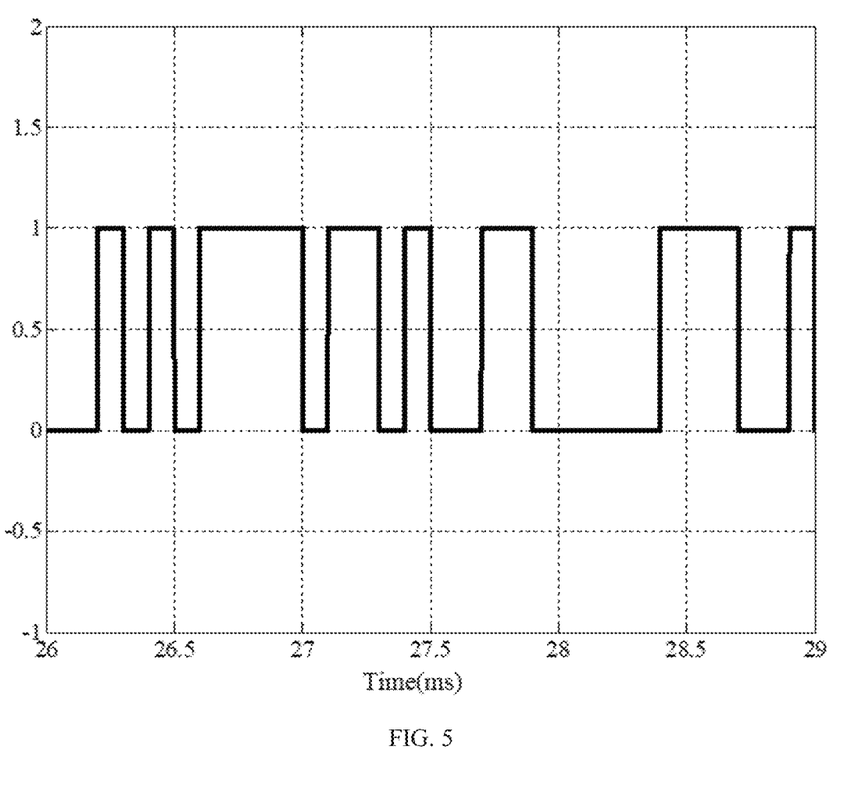
FIG. 5 is a schematic diagram of a waveform of a transmitted m-sequence pseudo random code.

In an embodiment, transmission voltages of the two transmitters are set to 500 V, a ground resistance is set to 20Ω, a waveform of a transmission current is a fundamental wave of 10 kHz, a waveform of an m-sequence pseudo random code with an order of 5 is shown in FIG. 5, a transmission pole pitch reaches 1000 m, and equivalent inductance of a power supply line is about 3 mH. Waveforms of currents output by the conventional single-transmitter system shown in FIG. 3, the MTEM transmitter system shown in FIG. 4, the transmitter with two transmission modules in the present invention, and the transmitter with four transmission modules in the present invention are respectively shown in FIG. 6, FIG. 7, FIG. 8, and FIG. 9.

Figure 6:
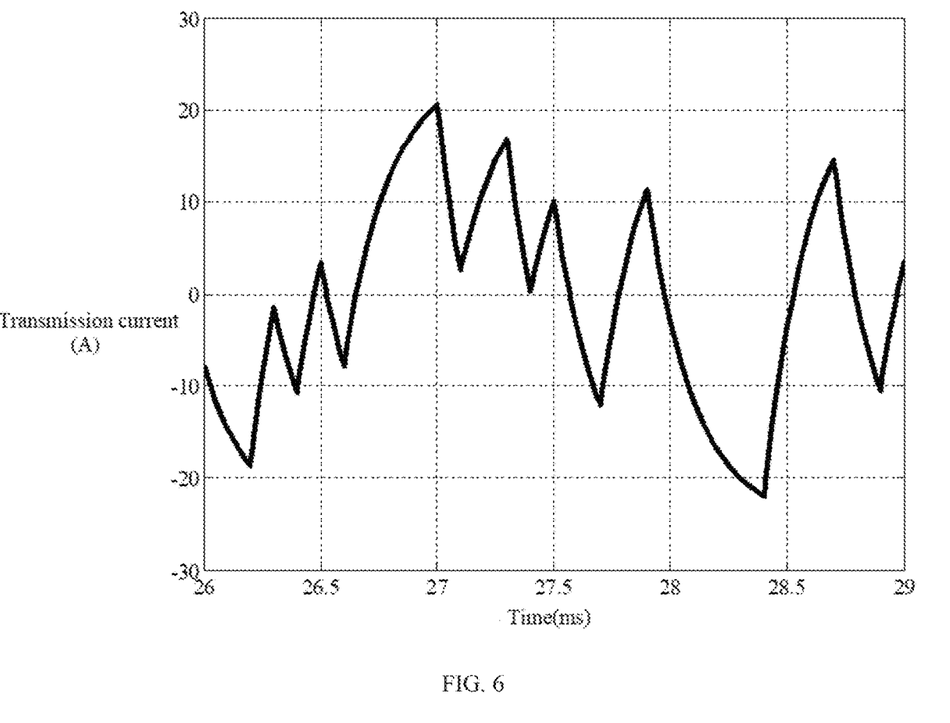
FIG. 6 is a schematic diagram of a waveform of a transmission current of a conventional transmitter structure.

As shown in FIG. 3 and FIG. 6, the waveform of the transmission current of the conventional single-transmitter system is totally distorted.

Figure 7:
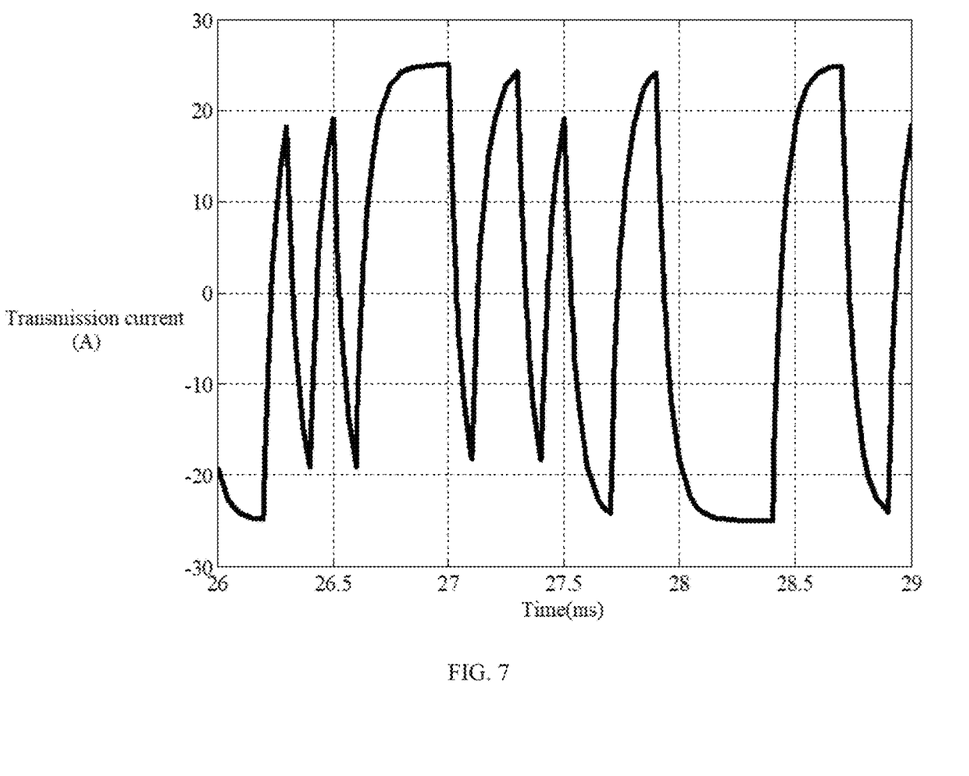
FIG. 7 is a schematic diagram of a waveform of a transmission current of an MTEM transmitter structure.

As shown in FIG. 4 and FIG. 7, the waveform of the transmission current of the MTEM transmitter structure differs greatly from the waveform of the m-sequence pseudo random code.

Figure 8:
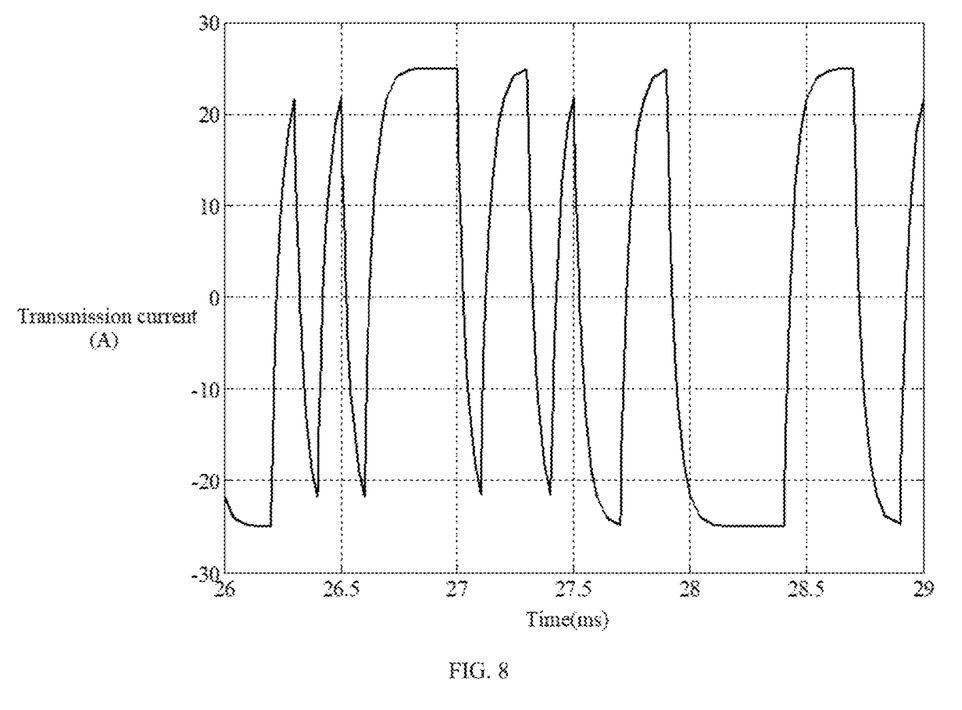
FIG. 8 is a schematic diagram of a waveform of a transmission current of a CSAMT transmitter shown in FIG. 1.
Figure 9:
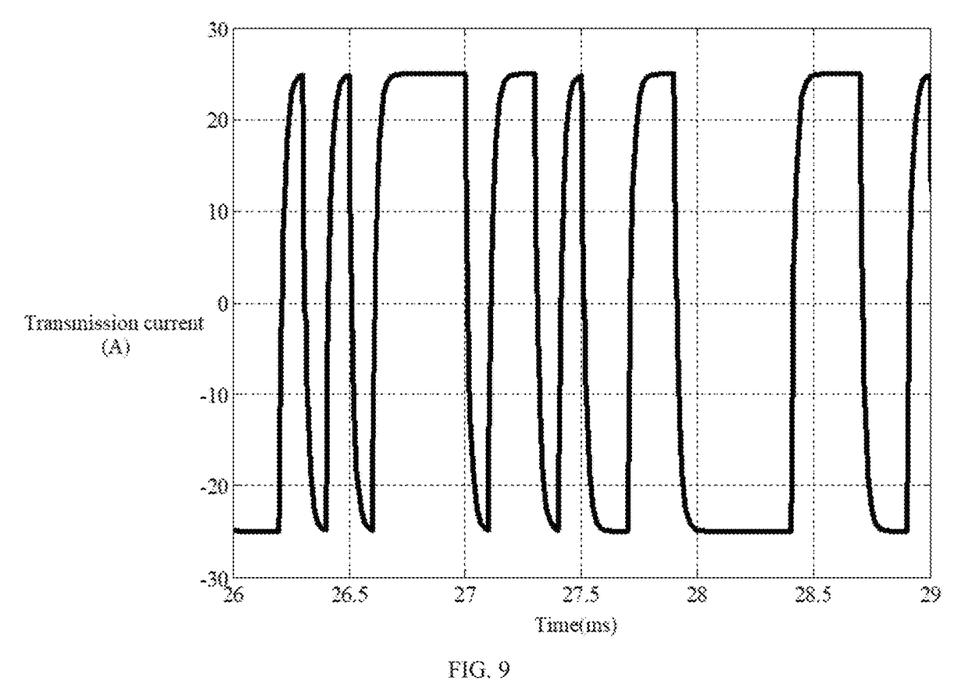
FIG. 9 is a schematic diagram of a waveform of a transmission current obtained when there are four transmission modules in the present invention.

As shown in FIG. 8, the waveform of the transmission current obtained when the CSAMT transmitter in the present invention includes two transmission modules is similar to the waveform of the transmission current of the MTEM transmitter system. However, after two transmission modules are added, the waveform of the transmission current is ideal, and no obvious deformation occurs in comparison with the schematic diagram of the waveform of the m-sequence pseudo random code shown in FIG. 5. It can be seen that the transmitter in the present invention is an open transmitter structure, and the number of transmission module pairs can be increased based on a requirement, to maintain a code type of the transmitted m-sequence pseudo random code.

The specific implementations of the present invention are described above, and constitute no limitation on the protection scope of the present invention. Any other corresponding modification and variation made based on the technical concept of the present invention shall fall within the protection scope of the claims of the present invention.

What is claimed is:

1. A CSAMT transmitter, comprising:
   a first transmitter, wherein the first transmitter comprises a first generator, a first rectifier module, a first transmission module, and a second transmission module, and the first generator is connected to the first transmission module and the second transmission module by using the first rectifier module; and
   a second transmitter, wherein the second transmitter comprises a second generator, a second rectifier module, a third transmission module, and a fourth transmission module, and the second generator is connected to the third transmission module and the fourth transmission module by using the second rectifier module, wherein
   the first transmission module is connected to the third transmission module, and the second transmission module is connected to the fourth transmission module; and
   the first transmission module has the same voltage as the third transmission module, and the second transmission module has the same voltage as the fourth transmission module.

2. The CSAMT transmitter according to claim 1, wherein the first transmission module and the second transmission module have the same synchronous drive signal, and the third transmission module and the fourth transmission module have the same synchronous drive signal.

3. The CSAMT transmitter according to claim 1, wherein a positive pole of power link of the first transmission module is connected to a positive pole of power link of the third transmission module, a negative pole of power link of the first transmission module is connected to a negative pole of power link of the third transmission module, a positive pole of power link of the second transmission module is connected to a positive pole of power link of the fourth transmission module, and a negative pole of power link of the second transmission module is connected to a negative pole of power link of the fourth transmission module.

4. The CSAMT transmitter according to claim 2, wherein a positive pole of power link of the first transmission module is connected to a positive pole of power link of the third transmission module, a negative pole of power link of the first transmission module is connected to a negative pole of power link of the third transmission module, a positive pole of power link of the second transmission module is connected to a positive pole of power link of the fourth transmission module, and a negative pole of power link of the second transmission module is connected to a negative pole of power link of the fourth transmission module.

5. The CSAMT transmitter according to claim 1, wherein both a bridge arm of the first transmission module and a bridge arm of the second transmission module are connected to a left electrode, and both a bridge arm of the third transmission module and a bridge arm of the fourth transmission module are connected to a right electrode.

6. The CSAMT transmitter according to claim 2, wherein both a bridge arm of the first transmission module and a bridge arm of the second transmission module are connected to a left electrode, and both a bridge arm of the third transmission module and a bridge arm of the fourth transmission module are connected to a right electrode.

7. The CSAMT transmitter according to claim 1, wherein upper switching transistors of the first transmission module and the second transmission module and lower switching transistors of the third transmission module and the fourth transmission module are simultaneously turned on or turned off; and lower switching transistors of the first transmission module and the second transmission module and upper switching transistors of the third transmission module and the fourth transmission module are simultaneously turned on or turned off.

8. The CSAMT transmitter according to claim 5, wherein transmission module extension can be further performed on the first transmitter, an extended transmission module is connected to the first rectifier module, and a bridge arm of the extended transmission module is connected to the left electrode; and transmission module extension can be further performed on the second transmitter, an extended transmission module is connected to the second rectifier module, and a bridge arm of the extended transmission module is connected to the right electrode.

9. The CSAMT transmitter according to claim 6, wherein transmission module extension can be further performed on the first transmitter, an extended transmission module is connected to the first rectifier module, and a bridge arm of the extended transmission module is connected to the left electrode; and transmission module extension can be further performed on the second transmitter, an extended transmission module is connected to the second rectifier module, and a bridge arm of the extended transmission module is connected to the right electrode.

10. The CSAMT transmitter according to claim 1, wherein the first transmission module is connected to the third transmission module by using a power supply line, and the second transmission module is connected to the fourth transmission module by using a power supply line.

11. The CSAMT transmitter according to claim 10, wherein a distance between the power supply lines is greater than 1 meter, and a distance between the ground and each of the power supply lines is greater than 1 meter.

* * * * *